United States Patent [19]

Celler et al.

[11] Patent Number: 4,835,113

[45] Date of Patent: May 30, 1989

[54] FABRICATION OF DIELECTRICALLY ISOLATED DEVICES WITH BURIED CONDUCTIVE LAYERS

[75] Inventors: George K. Celler, New Providence; Lee E. Trimble, Hillsborough, both of N.J.

[73] Assignee: American Telephone and Telegraph Company, AT&T Bell Laboratories, Murry Hill, N.J.

[21] Appl. No.: 123,695

[22] Filed: Nov. 23, 1987

Related U.S. Application Data

[63] Continuation-in-part of Ser. No. 912,908, Sep. 26, 1986, abandoned.

[51] Int. Cl.$^4$ .................................... H01L 21/225
[52] U.S. Cl. ............................ 437/37; 437/62; 437/63; 437/164
[58] Field of Search ............... 437/62, 63, 164, 37

[56] References Cited

FOREIGN PATENT DOCUMENTS 0170231 9/1985 Japan ...................... 437/62

0244047 12/1985 Japan .

OTHER PUBLICATIONS

McCaldin, J. Vac. Sci. Technol., vol. 11, No. 6, (Nov./Dec. 1974), pp. 990–995.
Celler, J. Crystal Growth, 63 (1983), pp. 429–444.
Singh et al., J. Electrochem. Soc.: Solid State Science and Technology, vol. 131, No. 11 (Nov. 1984), pp. 2645–2651.

Primary Examiner—Olik Chaudhuri
Attorney, Agent, or Firm—Bruce S. Schneider

[57] ABSTRACT

In dielectrically isolated devices a buried conducting layer adjacent to the dielectric layer is produced by a drift effect. In particular, if arsenic antimony and/or phosphorus is present in the silicon dioxide layer, it is caused to drift from this layer and enter the adjacent isolated silicon region while maintaining a relatively narrow spatial configuration. Thus, a discrete buried highly conductive layer is formed. This configuration is particularly useful for transistor configurations such as utilized in switching applications.

20 Claims, 1 Drawing Sheet

FABRICATION OF DIELECTRICALLY ISOLATED DEVICES WITH BURIED CONDUCTIVE LAYERS

CROSS REFERENCE TO RELATED APPLICATION

This application is a continuation-in-part of our co-pending application, Ser. No. 912,908, filed Sept. 26, 1986, now abandoned.

BACKGROUND OF THE INVENTION

1. Field of the Invention

This invention relates to electronic device fabrication and, more particularly, device fabrication involving doped layers.

2. Art Background

In most electronic components, such as integrated circuits, lateral separation is produced between regions of essentially single crystal silicon, i.e., silicon having less than a total of $10^{10}$ cm$^{-2}$ defects, e.g., linear and planar defects such as dislocations or stacking faults, respectively. This separation is accomplished by interposing between the single crystal silicon regions, a region of electrically insulating material having a thickness approximately equal to the depth of the active regions of the single crystal materials being separated. (The active region is that portion of the single crystal silicon which is modified to contain electronic device structures. The active region is typically 1 μm thick for nominal voltage devices.) Alternatively, a p-n barrier separates the device regions. In this manner, transistors or other devices formed in one single crystal region, i.e., one active region, are electrically isolated and are prevented from interacting with devices in a second active region.

Vertical isolation, in addition to lateral isolation, is advantageously employed in devices operating at nominal voltages where enhanced reliability is desired or in devices designed for high voltage operation. This vertical isolation is provided by underlying some, or most commonly all, of the single crystal silicon regions with a region of electrically insulating material. The additional insulating material providing vertical isolation prevents electron hole pairs formed in the underlying substrate by thermal processes or by ionizing radiation from migrating to an active region. Thus, errors in the processing of information by this migration are avoided. The vertical isolation also reduces capacitance and thus allows faster device operation. Additionally, for high voltage operation the vertical isolation prevents conduction induced by high voltage between active regions through the silicon substrate.

Various processes have been employed to produce a component having both lateral and vertical isolation. In one process described by Celler, et al, *Journal of the Electrochemical Society*, 132, 211 (1985), a silicon dioxide lined tube is produced in a silicon wafer. This tub is filled with polycrystalline silicon that is transformed into a single crystal region through appropriate high temperature thermal processing. In a second process oxygen is implanted into the silicon wafer and a silicon oxide buried region is subsequently formed by a high temperature annealing procedure. Thus, in general, the production of dielectrically isolated devices requires a high temperature treatment. (See also P. L. F. Hemment, *Materials Research Society Symposium Proceedings*, Vol. 33, pages 41-51 (1984).)

For certain applications such as electronic switching, e.g., switching in telecommunication systems, it is desirable to produce devices utilizing a buried conductive layer adjacent to the silicon dioxide isolating layer. For example, as shown in FIG. 1, a dielectric isolating region, 5, is utilized in conjunction with a drain and source (13 and 14 respectively) and a gate, 15. The buried conductive region, 16, acts as a drain. Similarly, in a bipolar configuration, an emitter, 20, a base, 21, and a dielectric region, 30, are employed. A buried conductive layer, 31, is utilized as the collector. In either configuration, a vertical orientation is utilized to decrease the resistance of the device in the on state and thus to increase the current flow. Additionally, this vertical device structure utilizes less single crystal silicon material and as a result allows a higher density of transistors within a dielectrically isolated region.

For fabrication schemes employing a high temperature treatment, e.g., a recrystallization process or a chemical segregation process, forming the conductive buried layer and maintaining the conductivity within a relatively limited spatial region is difficult. Typically, the high conductivity is produced by introducing a dopant into the region where enhanced electrical conductivity is required. Since this region is adjacent to a dielectric layer, it is often formed before the overlying silicon is deposited. Thus, any thermal treatment of the silicon in turn subjects the deposited region to an equivalent heat treatment. The effect of relatively high temperatures on the doped region is to cause an isotropic diffusion inducing concomitantly undesirable spatial broadening of the doped region. This effect is particularly pronounced when the thermal process involves melting. Clearly, any dopant present or diffused into the melted region is rapidly distributed. Thus, although certain advantageous techniques for producing dielectrically isolated devices have been developed, the flexibility of techniques depending on high temperature treatment, e.g., greater than 1250° C., has been somewhat limited to producing structures which do not require a buried conductive region.

SUMMARY OF THE INVENTION

Dielectric isolated devices having a buried conductive region are producible utilizing an unexpected thermal effect associated with arsenic, antimony and/or phosphorus entities as dopant. (For convenience, these dopants and combinations of these dopants will be generically called arsenic group entities in this disclosure.) It has been found that arsenic group entities introduced, e.g., implanted, into a silicon dioxide layer do not isotropically diffuse when subjected to a thermal gradient. In particular, a heat gradient induces the arsenic group entity to move through the silicon dioxide in the direction of higher temperature without significant broadening of the initial spatial configuration. Thus, arsenic group entities introduced in a narrow spatial region of silicon dioxide material, under the influence of a thermal gradient in the desired direction will enter the adjacent region without undergoing an unacceptable spatial broadening. The consequence of this anomalous behavior is significant. If a dielectric isolated device is fabricated with arsenic group species present in the buried silicon dioxide layer, the production of a suitable thermal gradient for an extended period produces a drift of arsenic group entities through the silicon dioxide layer into the adjacent silicon region without any significant broadening of its spatial configuration. Thus, short thermal treatment such as generally associated with melting or annealing of vertically isolated devices, or even a prolonged heat treatment under isothermal conditions, does not affect the buried dopant, but subsequent extended production of a thermal gradient induces distribution of the dopant in the desired region. In this manner, a vertical transistor configuration (either bipolar or field effect transistor structure) with a buried conductive region is produced without the undesirable broadening of the buried conductive layer associated with previous fabrication schemes. Additionally, the same gradient technique is employable for devices without vertical isolation to aid in device fabrication.

DETAILED DESCRIPTION

Figure 1:
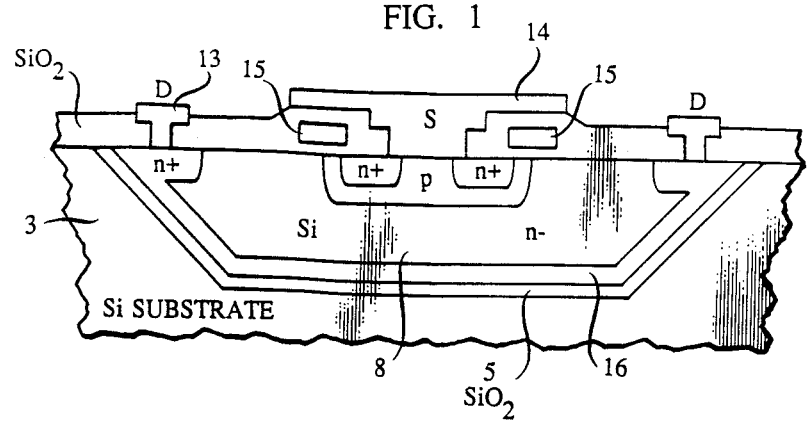
FIGS. 1–3 are illustrative of one device that is formed by the inventive process.

The silicon substrate, the dielectric layer, 5, in FIG. 1, and the tub region, 8, are produced by conventional techniques such as described in Celler et al supra. (The tub, i.e., a region set into the substrate, is not essential, but is advantageously utilized.) Briefly, these structures are produced by first etching a region encompassed by 5, 8, and 16 in FIG. 1 out of the substrate, 3, and then producing an oxide layer, 5, such as by thermal oxidation of the exposed silicon surface. Other fabrication sequences such as described in L. Pfeiffer et al, *Applied Physics Letters*, 43, 1048 (1983) are also suitable. The silicon dioxide layer is then preferably implanted with arsenic group entities. Although implantation is the preferred method of producing arsenic group entities in the silicon dioxide layer, the method of introducing the arsenic group entity is not critical and any method yielding an appropriate dopant concentration and distribution is acceptable. The particular valence state of the arsenic group material is also not critical. However, it is desirable that the density of arsenic group entities, e.g., implanted arsenic group entities, in the silicon dioxide layer is at least one atomic percent for arsenic, at least 0.5 atomic percent for antimony and approaching 33 atomic percent for phosphorus—concentrations corresponding to an implantation dose and energy of respectfully $3 \times 10^{15} cm^{-2}$ at 100 keV, $10^{15} cm^{-2}$ at 140 keV, and $10^{17} cm^{-2}$ at 50 keV. These concentration levels are desirable since they yield suitable spatial configurations and because they leads to a buried conductive silicon layer having a conductivity of at least $10^{19} cm^{-3}$. (Significantly lower concentrations lead to conventional diffusion rather than drift.) This level of conductivity is generally desirable for appropriate operation of devices dependent on a buried conductive layer. The silicon dioxide region with its arsenic group entities is then covered with a silicon region, 8, and 16. This region is produced by conventional techniques such as chemical vapor deposition as described in S. M. Sze, *VLSI Technology*, Chapter 2, McGraw-Hill (1983).

Alternatively, it is possible to produce a suitable configuration by implanting oxygen entities into a silicon substrate to form a silicon oxide layer or if implanted to different depths to form silicon oxide layers. (The introduction of oxygen entities is fully described in P. L. F. Hemment, *Materials Research Society Symposium Proceedings*, Vol. 33, page 41 (1984).) After annealing, required to condense oxygen into oxide, arsenic group entities are implanted into the particular layer from which drift is desired. Such drift into a region is more desirable than direct implantation of arsenic group entities into the region in situations where extensive high temperature treatments are necessary after introduction of such entities. One such case is when multiple oxide layers are formed by oxygen implantation and high temperature annealing. The arsenic group entities should be introduced into the lower silicon dioxide layer before the next oxide layer is formed since implantation through thick overlying layers is not practical. However, if the arsenic group entity were implanted into silicon, the heat treatment required for the formation of subsequent layers smears any patterns of high conductivity in the silicon. Thus, drift of the arsenic group entity is advantageously employed in this situation as well. The arsenic group entities are employed in the same dose levels as described above.

Figure 2:
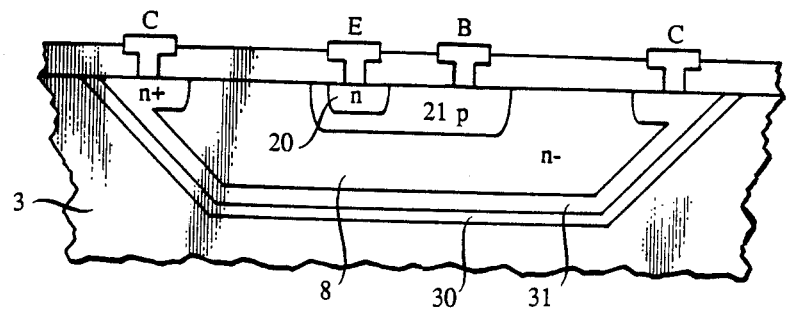

After the appropriate configuration has been produced, thermal processing of the silicon dioxide/silicon structure is performed. For example, in the configuration shown in FIG. 1 or 2, the polycrystalline silicon region occupying region, 8, is converted into a single crystal region by a variety of thermal techniques such as that described in Celler et al supra. In the second procedure where $SiO_2$ is formed by implanting oxygen, the silicon dioxide region is advantageously annealed by the technique described in U.S. Pat. No. 4,676,841 issued June 30, 1987, where is hereby incorporated by reference.

Appropriate drift of the arsenic group entities through the silicon dioxide region with introduction into a narrow region of the adjacent silicon material is produced by subjecting the silicon oxide region to a thermal gradient with the higher temperature in the direction of desired drift. This gradient is most easily produced by directly heating only one surface of the silicon active region to an elevated temperature. Generally, subjecting the silicon surface to a temperature typically above 1200° C., preferably above 1300° C. is appropriate. The precise temperature suitable for producing a desired introduction of arsenic group entities into the silicon region is dependent on the thickness of the $SiO_2$ region that the arsenic group entities must traverse. Typically, for silicon dioxide thicknesses in the range 0.1 to 4 μm, temperatures in the range of 1200° to 1410° C. are employed. Under these conditions, temperature gradients in the silicon dioxide ranging from 100° C./cm to 2000° C./cm are obtained resulting in linear drift rates ranging approximately from 50 to 3000 Å/hr. Thus the thermal conditions associated with annealing or conversion of polycrystalline into single crystal silicon are generally not appropriate for producing the desired drift of arsenic group entities since such processes are typically less than 1 minute in duration and/or do not always include temperature gradients.

Figure 3:
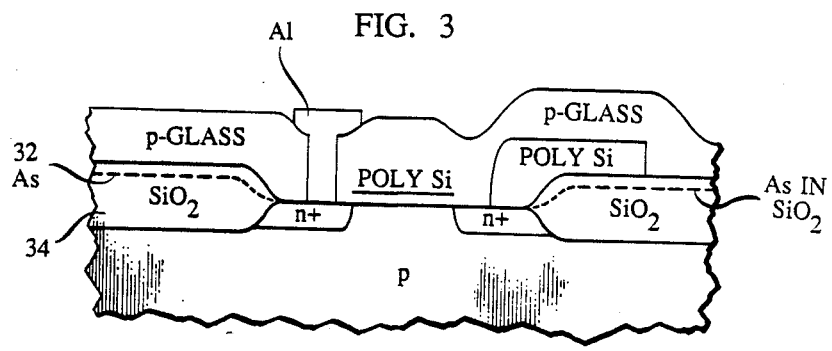

Although the primary use of the above described invention is for producing devices with a buried layer, such as dielectrically isolated devices, the presence of arsenic group entities in other devices also has consequences. Since arsenic group entities will rapidly drift in a thermal gradient (as opposed to an isotropic thermal environment), devices in which arsenic group entities are present in silicon dioxide where rapid movement of the arsenic group entity is not desired should not be subjected to such thermal gradient. Thus, in a device such as shown in FIG. 3 where the arsenic group entities, 32, in silicon dioxide region, 34, must be maintained, a thermal gradient over an extended time interval, i.e., an interval sufficient to produce undesired drift, should be avoided. Conversely, in another embodiment, it is possible to employ the drift process by employing arsenic group doped oxide as a dopant source for achieving high concentrations of As in an adjoining Si region. This configuration without the drift process is often difficult to produce because a) in an inert ambient As group entities are immobile; b) in an oxidizing ambient As group entities diffuse but the silicon is consumed by oxidation. Therefore, in this latter case, the $Si/SiO_2$ interface moves away from the source of As group dopant.

It is also possible to use the drift effect to produce a change in refractive index in a desired region. For example, the presence of phosphorus causes a refractive index change of 0.0016 for each atomic percent present in silicon dioxide. Thus, the surface of, for example, a quartz substrate, could be doped and drift utilized to produce a buried region of higher refractive index after subjecting the plate to the thermal gradient. Such structures are useful in a variety of optical devices. It also should be noted that phosphorus, once it reaches a silicon region, diffuses significantly more quickly than other arsenic group entities. Thus, for the manufacture of a buried layer device employing a silicon region adjacent to the source silicon dioxide region, thermal conditions should be carefully controlled to avoid excessive movement when the dopant reaches the silicon. Additionally, phosphorus implantation into the silicon dioxide tends to increase the conductivity of this dielectric region. Therefore, devices produced utilizing phosphorus dopant as opposed to arsenic or antimony dopant have somewhat decreased electrical properties.

If an arsenic group entity drift is desired, it should advantageously be performed in the absence of oxygen atmosphere contact with the arsenic group entities. An oxygen environment suppresses drift and induces a conventional diffusion. This diffusion swamps the drift in the silicon dioxide, and in turn induces a significant broadening of the arsenic group entity spatial configuration. Thus, in one advantageous embodiment, the drift procedure is performed so that oxidant is not allowed to reach the As group entity. For example, in the buried layer configuration, $SiO_2$ is sandwiched between two silicon regions and thus is shielded from the ambient. (The overlying silicon layer also ensures an appropriate temperature gradient when utilized with appropriately directed radiant energy.) Additionally, although thermal processing utilizing heat lamps is advantageously utilized, other heat sources such as lasers are also suitable to produce the desired thermal gradient. If laser light is utilized to heat a localized region, it is possible to induce drift in the associated underlying localized region. Thus, it is possible through confining the heat source to confine in turn the region where arsenic group entity drift occurs. In this manner, the lateral boundaries of the buried conductive region produced by the drift procedure is also controlled.

The following examples are illustrative of the invention.

EXAMPLE 1

A p-type wafer (boron doped) with a resistivity between 20 and 100 ohm-cm was employed. The wafer was cut so that its major surface was in the (100) plane and so that it had a diameter of approximately 10 cm. The wafer was thoroughly cleaned both mechanically and chemically. The wafer was placed on the sample holder of a wet oxidation furnace and maintained at 1050° C. in steam for a sufficient time to produce a 400 nm thick thermal oxide region. The wafer was then removed from the furnace and positioned on the sample holder of a commercial ion implantation apparatus with the oxide surface exposed for implantation. Arsenic was implanted utilizing an acceleration potential of 100 keV. The dose was approximately $1 \times 10^{16}$ ions per $cm^2$. The average stopping range for the arsenic entities under these conditions was 60 nm. The wafer was removed from the ion implantation and inserted on the sample holder of a low pressure chemical vapor deposition (LPCVD) apparatus. Polycrystalline silicon was deposited to a thickness of approximately 1500 nm utilizing the procedure described in Chapter 3 of *VLSI Technology* edited by S. M. Sze, McGraw-Hill (1983). A temperature of approximately 620° C. at the sample holder was employed for decomposition of the silane.

The wafer was transferred to the lamp furnace described in U.S. Pat. 4,494,303 dated Jan. 22, 1985 (which is hereby incorporated by reference). However, no oxygen flow was introduced into the apparatus. The power supplied to the lamps was slowly increased by a ramping procedure as described in U.S. Pat. No. 4,581,814 dated Apr. 15, 1986 (which is also hereby incorporated by reference).

Before exposure, the side of the wafer opposite the implanted silicon dioxide region was abraded and this side was exposed to the energy from the lamp. When the maximum temperature of about 1405° C. was reached after ramping, it was maintained for 20 minutes. The intensity of the lamps was then linearly decreased over a 60 second interval. The resulting drift of the arsenic entities was measured by Rutherford back scattering. The heating procedure was then again repeated with a 20 minute interval at the highest temperature. The resulting further induced drift was measured. The procedure of further exposure and subsequent measurement was conducted until a total exposure time of 120 minutes was reached. The measurements indicated a drift rate that varied approximately linearly with time and that was about 200 nm per hour. (After approximately 100 minutes of treatment, substantially all the arsenic had reached the silicon substrate.)

EXAMPLE 2

The procedure of Example 1 was followed except a 1100 nm thick thermal oxide was produced by steam oxidation. Additionally, 1000 nm of silicon dioxide was deposited over the thermal oxide after implanting the arsenic in the thermal oxide. This deposition was induced by the LPCVD procedure described in Example 1 except a temperature of 430° C. was utilized together with a silane/oxygen mixture of about 1:3. The resulting oxide was densified in a 900° C. furnace for 30 minutes in wet oxygen. A 50 μm thick poly-crystalline silicon layer was then deposited on the densified silicon dioxide by the procedure described in column 6 of U.S. Pat. No. 4,581,814 utilizing a deposition time period of approximately 10 minutes. A heat gradient was produced as described in Example 1 herein. However, a treatment period of one hour was employed. Additionally, six further identically processed wafers were treated, each with a treatment time interval of one hour longer than the preceding wafer. Measurements taken by Rutherford back scattering and transmission electron microscopy indicated that drift did not begin until a treatment time of approximately 2 hours was completed. Once drift began the rate of movement was approximately linear with a speed of approximately 200 nm per hour. The delay before the inception of drift can be explained in terms of a contemplated mechanism. It is believed that drift occurs after formation of microscopic arsenic-rich droplets with diameter between 1030 nm. It is further believed that for the sample utilized in this example, droplet formation required approximately 2 hours. This belief is confirmed by an observation of droplet formation in electron micrographs.

EXAMPLE 3

A 4000 nm thick thermal oxide layer was deposited on a 10 cm wafer by the steam oxidation procedure described in Example 1 except the growth was continued for 16 hours at 1240° C. (The wafer utilized had a resistivity of approximately 150 ohm-cm.) The oxide was then implanted as described in Example 1 except a dose of $6 \times 10^{15}$ ions per cm$^2$ was employed. An overlying 200 nm thick region of undoped silicon dioxide was deposited as described in Example 2.

A layer of conventional photoresist was spun onto the major surface of the substrate opposite the oxide layer. This photoresist was baked at 65° C. for 30 minutes. By the same procedure photoresist was spun onto the silicon dioxide side of the wafer and baked. The photoresist layer on the silicon dioxide surface was exposed utilizing a mask having openings extending the length of the substrate with the opening width 150 μm and with the spacing between the openings approximately 4 mm. The exposure dose and subsequent development procedure were conventional and tailored to produce openings replicating the mask through the thickness of the photoresist. The uncovered region of the oxide was etched through the entire thickness of all the oxide regions by immersion in a hot HF bath. The photoresist was then removed from both sides of the wafer with a conventional stripper. One hundred micrometers of polycrystalline silicon was then applied on the delineated silicon dioxide region utilizing an AMV 1200 (an apparatus manufactured by Applied Materials Corporation) by the procedure described in Example 2. During this procedure the wafer surface was first etched for 15 seconds at 1200° C. with HC1. Polycrystalline silicon was nucleated at 1050° C. for 5 minutes utilizing 13.5 mole percent silane. One hundred micrometers of polycrystalline silicon (undoped) was then deposited on the nucleating layer at 1150° C. for 20 minutes utilizing SiHCl$_3$ at a flow rate of 18 grams per minute in the presence of a 95 liter per minute hydrogen flow and a 0.88 liter per minute flow of HC1. A 2 μm thick cap layer of undoped silicon dioxide was deposited by the LPCVD procedure described in Example 2.

The wafer was inserted on the sample holder of the lamp furnace described in Example 1. The temperature was increased linearly over a 60 second interval from room temperature to the temperature obtained at about 100 kW lamp power. The temperature was then maintained at this level for 30 seconds to induce recrystallization of polycrystalline silicon through a melting procedure. After this 30 second interval, the lamp power was decreased in an approximately linear fashion to zero intensity over a 120 second interval. It was determined by spreading resistance and Rutherford back scattering measurements that during the recrystallization process essentially no drift of arsenic entities occurred. Additionally, it was observed that no significant conventional diffusion occurred. The wafer was then returned to the furnace and treated as described in Example 2 except the silicon dioxide side of the wafer rather than the substrate side was exposed to the lamp intensity. It was observed by Rutherford back scattering and electrical measurements that the arsenic entities drifted at a rate of approximately 150 nm per hour through the silicon dioxide region and reached the silicon dioxide/recrystallized silicon interface after approximately 2 hours.

EXAMPLE 4

A 400 nm thick thermal oxide was grown on a p-type silicon wafer (20–40 ohm-cm resistivity) by the steam oxidation procedure described in Example 1. Approximately 150 nm of an arsenic doped spun-on silicon dioxide film was deposited onto the silicon dioxide surface. (The precursor material for spinning this film was supplied by Emulsitone Company, Whippany, N.J.). The precursor material was a proprietary product but was basically an ethyl alcohol solution containing arsenic and silicon compounds. The spinning was performed at 3000 rpm for 70 seconds. The spun-on film was densified by heating in air at 800° C. for one hour. The resulting silicon dioxide layer was doped to a concentration of $6 \times 10^{21}$/cm$^3$. An undoped layer of spun-on silicon dioxide film having a thickness of approximately 150 nm was deposited utilizing the film precursor spin-on material described above except this precursor material had no arsenic entities. This second spin-on film was deposited and baked as previously described for the undoped material. A polycrystalline silicon layer (2.2 um in thickness) was then deposited on the silicon dioxide as described in Example 3 utilizing a reactor maintained at atmospheric pressure with a hydrogen flow rate of 95 liters per minute, a silane flow rate of 0.1 liters per minute and with no HC1 flow. Deposition was induced at 1050° C. and was continued for 4 minutes. A gradient for heat treatment was induced as described in Example 1 and similar results to those reported in Example 1 were observed.

EXAMPLE 5

The procedure of Example 1 was followed except an antimony rather than arsenic dopant was utilized. The antimony was implanted at various levels including $1 \times 10^{15}$, $1 \times 10^{16}$, and $3 \times 10^{16}$ cm$^{-2}$ in separate samples. Each sample demonstrated the same drift effect as observed for arsenic. However, the drift rate was approximately 140 nm per hour. The measurements were taken over a time period of 180 minutes. After approximately 160 minutes of treatment substantially all the antimony had reached the silicon substrate.

EXAMPLE 6

The procedure of Example 1 was followed except phosphorus was utilized as a dopant. The phosphorus was implanted at 50 keV utilizing a dose of $1 \times 10^{17}$ cm$^{-2}$. After the phosphorus implantation, in contrast to the procedure in Example 1, approximately 2000 additional Angstroms of silicon oxide formed by the LPCVD technique described in Example 2 was utilized. Following this additional deposition of silicon dioxide, approximately 20 micrometers of silicon was deposited by the procedure described in Example 3 except the total time utilized to achieve this thickness was approximately 4 minutes. After 3 hours of subjecting the sample to the same temperature gradient as described in Example 1, the extent of phosphorus present in the silicon was measured by the spreading resistance method. (See, R. G. Mazur and D. H. Dickey, *Journal of the Electrochemical Society,* 113, 255 (1966), for a description of this method.) The measurement indicated that a carrier concentration of approximately $2\times 10^{19} \text{cm}^{-3}$ was present. If the substrate was subjected to a temperature of 1400 degrees Centigrade in a manner that produced no temperature gradient, conventional isotropic diffusion was observed. In contrast, if the gradient was in the opposite direction from that produced in Example 1, a concentration of about $4\times 10^{17} \text{cm}^{-3}$ was observed near the oxide silicon interface, i.e., a concentration approximately 100 times less than that produced by the gradient utilized in Example 1.

What is claimed is:

1. A method of making a device comprising the steps of (1) forming a structure including (a) a region comprising silicon dioxide and containing arsenic entities, and (b) a region comprising silicon wherein said region of silicon dioxide is adjacent to said region of silicon and (2) completing said device, wherein thermal gradients produced during said completion of said device are controlled to in turn control the drift of said arsenic entities into a solid portion of said region of silicon.

2. The method of claim 1 wherein said device includes a vertically isolated region of single crystal silicon.

3. The method of claim 2 wherein said region of single crystal silicon is formed from said region of silicon.

4. The method of claim 3 wherein said formation is produced by thermally induced recrystallization.

5. The method of claim 2 wherein said thermal gradient is utilized to induce drift of said arsenic entities from said region of silicon dioxide to said region of silicon thereby producing a buried region of high conductivity.

6. The method of claim 1 wherein said thermal gradient is utilized to induce drift of said arsenic entities from said region of silicon dioxide to said region of silicon thereby producing a region of high conductivity.

7. The method of claim 1 wherein said method includes a nonisothermal step and wherein thermal gradients are limited to avoid substantial drift of said arsenic group entities.

8. The method of claim 1 wherein said arsenic entities are introduced into said region of silicon dioxide by ion implantation.

9. The method of claim 1 wherein said region of silicon dioxide is formed from a spin-on glass.

10. The method of claim 1 wherein said thermal gradient is produced by radiant energy.

11. A method of making a device comprising the steps of (1) forming a structure including (a) a region comprising silicon dioxide and containing a member chosen from the group consisting of phosphorus entities and antimony entities, and (b) a region comprising silicon wherein said region of silicon dioxide is adjacent to said region of silicon and (2) completing said device, wherein thermal gradients produced during said completion of said device are controlled to in turn control the drift of said arsenic group entities into a solid portion of said region of silicon.

12. The method of claim 11 wherein said device includes a vertically isolated region of single crystal silicon.

13. The method of claim 12 wherein said region of single crystal silicon is formed from said region of silicon.

14. The method of claim 13 wherein said formation is produced by thermally induced recrystallization.

15. The method of claim 12 wherein said thermal gradient is utilized to induce drift of said member from said region of silicon dioxide to said region of silicon thereby producing a buried region of high conductivity.

16. The method of claim 11 wherein said thermal gradient is utilized to induce drift of said member from said region of silicon dioxide to said region of silicon thereby producing a region of high conductivity.

17. The method of claim 11 wherein said method includes a non-isothermal step and wherein thermal gradients are limited to avoid substantial drift of said member.

18. The method of claim 11 wherein said members are introduced into said region of silicon dioxide by ion implantation.

19. The method of claim 11 wherein said region of silicon dioxide is formed from a spin-on-glass.

20. The method of claim 11 wherein said thermal gradient is produced by radiant energy.

* * * * *

UNITED STATES PATENT AND TRADEMARK OFFICE
CERTIFICATE OF CORRECTION

PATENT NO. : 4,835,113

DATED : May 30, 1989

INVENTOR(S) : G. K. Celler, L. E. Trimble

It is certified that error appears in the above-identified patent and that said Letters Patent is hereby corrected as shown below:

Col. No. 1, Line No. 58, "tube" should read --tub--

Col. No. 7, Line No. 4, "formationof" should read --formation of--

Col. No. 7, Line No. 5, "1030" should read --10-30--

Col. No. 7, Line 43, "HCl" should read --HCl-- (lower case L)

Col. No. 7, Line 48, "SiHCl$_3$" should read --SiHCl$_3$-- (lower case L)

Col. No. 7, Line 50, "HCl" should read --HCl-- (lower case L)

Col. No. 8, Line 31, "um" should read --μm--

Col. No. 8, Line 35, "HCl" should read --HCl-- (lower case L)

Signed and Sealed this

Twentieth Day of March, 1990

Attest:

JEFFREY M. SAMUELS

Attesting Officer

Acting Commissioner of Patents and Trademarks